United States Patent
Tsunoda

(10) Patent No.: US 10,057,050 B2
(45) Date of Patent: Aug. 21, 2018

(54) SIGNAL RECOVERY CIRCUIT, ELECTRONIC DEVICE, AND SIGNAL RECOVERY METHOD

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/399,815

(22) Filed: Jan. 6, 2017

(65) Prior Publication Data
US 2017/0244545 A1 Aug. 24, 2017

(30) Foreign Application Priority Data
Feb. 18, 2016 (JP) .................................. 2016-028838

(51) Int. Cl.
*H03D 3/24* (2006.01)
*H04L 7/033* (2006.01)
(Continued)

(52) U.S. Cl.
CPC .......... *H04L 7/0331* (2013.01); *H03L 7/0805* (2013.01); *H03L 7/0807* (2013.01);
(Continued)

(58) Field of Classification Search
CPC ....... H03L 7/0807; H03L 7/087; H03L 7/091; H03L 7/093; H03L 7/099; H03L 7/107;
(Continued)

(56) References Cited

U.S. PATENT DOCUMENTS

| | | |
|---|---|---|
| 5,414,741 A | 5/1995 | Johnson |
| 5,633,899 A | 5/1997 | Fiedler et al. |

(Continued)

FOREIGN PATENT DOCUMENTS

| | | |
|---|---|---|
| JP | 6-216765 A | 8/1994 |
| JP | 9-147499 | 6/1997 |

(Continued)

OTHER PUBLICATIONS

Ansgar Pottbäcker et al., "A Si Bipolar Phase and Frequency Detector IC for Clock Extraction up to 8 Gb/s", IEEE Journal of Solid-State Circuits, vol. 27, No. 12, Dec. 1992, pp. 1747-1751 (5 pages).

(Continued)

*Primary Examiner* — Rahel Guarino
(74) *Attorney, Agent, or Firm* — Fujitsu Patent Center

(57) ABSTRACT

A signal recovery circuit includes an oscillator configured to control a frequency of generating first clock, and a feedback circuit configured to control the oscillator in order that input data is synchronized with the first clock in accordance with a phase relation between the input data and the first clock, wherein the feedback circuit includes a controller configured to control the oscillator in accordance with the phase relation between the input data and the first clock, a first phase detector configured to generate a clock phase control signal in accordance with the phase relation between the input data and the first clock, and a state detection circuit configured to detect whether the signal recovery circuit is in a locked state or an unlocked state, based on a magnitude of an amplitude of a first component or a second component of the clock phase control signal.

10 Claims, 14 Drawing Sheets

(51) Int. Cl.
  *H03L 7/08* (2006.01)
  *H03L 7/087* (2006.01)
  *H03L 7/099* (2006.01)
  *H04L 7/00* (2006.01)

(52) U.S. Cl.
  CPC ............. *H03L 7/087* (2013.01); *H03L 7/099* (2013.01); *H04L 7/0004* (2013.01); *H04L 7/033* (2013.01)

(58) Field of Classification Search
  CPC ... H03L 7/095; H03L 7/1075; H03L 2207/06; H03L 7/081; H03L 7/1072; H04L 7/0087; H04L 7/0338; H04L 7/04; H04L 27/227; H04L 2027/0053; H04L 2027/0063
  See application file for complete search history.

(56) References Cited

U.S. PATENT DOCUMENTS

| | | | |
|---|---|---|---|
| 5,838,205 | A | 11/1998 | Ferraiolo et al. |
| 7,646,840 | B2 | 1/2010 | Hoffmann |
| 9,036,764 | B1 | 5/2015 | Hossain et al. |
| 9,565,015 | B1 | 2/2017 | Tsunoda |
| 2002/0051510 | A1 | 5/2002 | Noguchi |
| 2002/0057479 | A1 | 5/2002 | Takeshita et al. |
| 2002/0061087 | A1 | 5/2002 | Williams |
| 2002/0061088 | A1 | 5/2002 | Kon |
| 2006/0250192 | A1 | 11/2006 | Hsieh |
| 2007/0058768 | A1 | 3/2007 | Werner |
| 2007/0121772 | A1* | 5/2007 | Wada ............... H03L 7/07 375/371 |
| 2009/0122939 | A1 | 5/2009 | Hoang et al. |
| 2011/0096884 | A1 | 4/2011 | Chatwin |
| 2014/0286469 | A1 | 9/2014 | Shibasaki et al. |
| 2017/0244545 | A1 | 8/2017 | Tsunoda |

FOREIGN PATENT DOCUMENTS

| | | |
|---|---|---|
| JP | 11-355111 A | 12/1999 |
| JP | 2002-135093 | 5/2002 |
| JP | 2002-198808 | 7/2002 |
| JP | 2010-141594 A | 6/2010 |
| JP | 2014-187561 | 10/2014 |

OTHER PUBLICATIONS

U.S. Office Action dated Oct. 19, 2017 for co-pending U.S. Appl. No. 15/624,743, 17 pages.
Notice of Allowance dated Dec. 12, 2016 for co-pending U.S. Appl. No. 15/211,079, 14 pages.
U.S. Office Action dated Jun. 13, 2018 for co-pending U.S. Appl. No. 15/624,743, 21 pages.

* cited by examiner

SIGNAL RECOVERY CIRCUIT, ELECTRONIC DEVICE, AND SIGNAL RECOVERY METHOD

CROSS-REFERENCE TO RELATED APPLICATION

This application is based upon and claims the benefit of priority of the prior Japanese Patent Application No. 2016-028838, filed on Feb. 18, 2016, the entire contents of which are incorporated herein by reference.

FIELD

The embodiments discussed herein are related to a signal recovery (Clock Data Recovery: CDR) circuit, an electronic device on which the signal recovery circuit is mounted, and a signal recovery method.

BACKGROUND

Along with improvement in performance of information processing apparatuses such as devices for communication trunk and servers, a high data rate in transmission/reception of signals in the inside and outside of the devices is demanded. A higher bit rate is desired in the field of high-speed I/O in which signals are transmitted and received in an integrated circuit chip, between chips (in a device, between devices) and the field of optical communications, for example.

A reception circuit is requested to determine transmitted data at a right timing and recover data and a clock (Clock and Data Recovery: CDR). The CDR is implemented by detecting a phase difference and a frequency difference between the input data and the received (sampling) clock, and performing phase adjustment on the sampling clock based on the detected information. Among the reception circuits, known is a CDR circuit that is retimed by a clock recovered from input data without using a reference clock and outputs data in which jitter is decreased.

In the CDR circuits, known is the use of a phase detector (PD) that detects a phase difference between input data and a clock. The CDR circuit is controlled such that the phases and the frequencies of the input data and a first clock respectively match each other, based on the phase difference detected by the phase detector. A state where the frequencies match each other is called a locked state. Further, a state that is not the locked state is herein called an unlocked state.

Related art are disclosed in Japanese Laid-open Patent Publication Nos. 2002-198808, 2002-135093, 2014-187561, and 9-147499. In addition, Related art are disclosed in Ansgar Pottbacker, et al., "A Si Bipolar Phase and Frequency Detector IC for Clock Extraction up to 8 Gb/s," IEEE Journal of Solid-State Circuits, Vol. 27, No. 12, December 1992 (hereinafter, referred to as "Non-patent document 1").

SUMMARY

According to an aspect of the invention, a signal recovery circuit includes an oscillator configured to control a frequency of generating first clock, and a feedback circuit configured to control the oscillator in order that input data is synchronized with the first clock in accordance with a phase relation between the input data and the first clock, wherein the feedback circuit includes a controller configured to control the oscillator in accordance with the phase relation between the input data and the first clock, a first phase detector configured to generate a clock phase control signal in accordance with the phase relation between the input data and the first clock, and a state detection circuit configured to detect whether the signal recovery circuit is in a locked state or an unlocked state, based on a magnitude of an amplitude of a first component or a second component of the clock phase control signal, a frequency of the first component being higher than a frequency of the second component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A illustrates a block diagram and FIG. 1B illustrates a relation among the input data, the clock, and output data;

FIG. 2A illustrates the circuit example of the PD, and FIG. 2B illustrates the time chart;

FIG. 3A illustrates a block diagram, and FIG. 3B is a block diagram illustrating a configuration of the PFD;

FIG. 4A illustrates waveforms in a state where the frequencies of the input data and a first clock are different from each other, and FIG. 4B illustrates waveforms in a normal locked state where the frequencies and the phases respectively match each other;

FIG. 5A illustrates a block diagram, and FIG. 5B is a time chart illustrating an operation when the CDR circuit is started;

FIG. 11A illustrates a circuit diagram of the high-pass filter, FIG. 11B illustrates a circuit diagram of the band pass filter, and FIG. 11C illustrates the frequency characteristics;

DESCRIPTION OF EMBODIMENTS

A phase detector in which a frequency range that allows clock recovery is narrow has such a problem of incapable of detecting the transition from a locked state to an unlocked state.

Embodiments implement a signal recovery circuit that detects the transition from a locked state to an unlocked state based on an output from the phase detector.

Before describing the embodiments, a typical clock data recovery (CDR) circuit will be described.

Figure 1A:
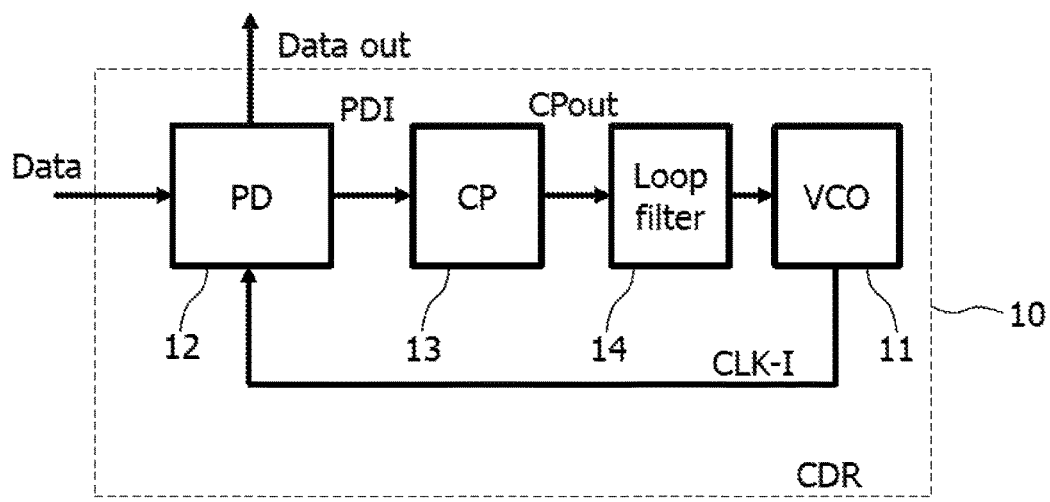
FIGS. 1A and 1B are diagrams illustrating a CDR circuit using a phase detector that detects a phase difference between input data and a clock.
Figure 1B:
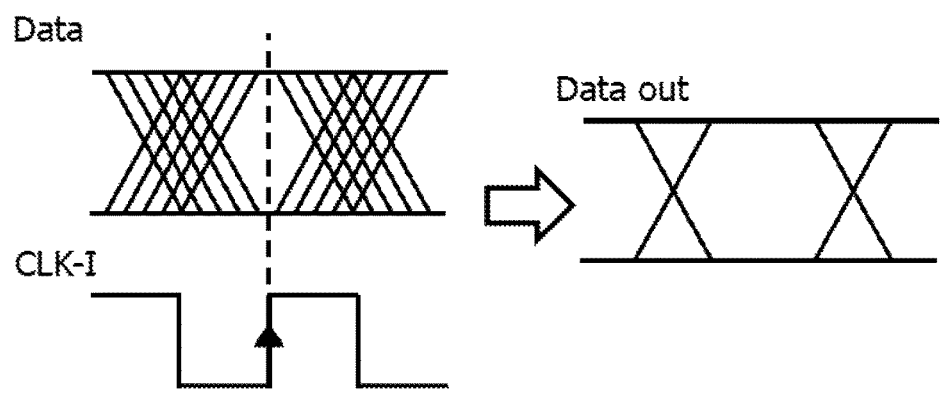

FIGS. 1A and 1B are diagrams illustrating a CDR circuit using a phase detector (Phase Detector: PD) that detects a phase difference between input data and a clock, and FIG. 1A illustrates a block diagram and FIG. 1B illustrates a relation among the input data, the clock, and output data.

As illustrated in FIG. 1A, a CDR circuit 10 includes a voltage control oscillator (VCO) 11, a phase detector (PD) 12, a charge pump (CP) 13, and a loop filter 14. The VCO 11 is not limited to the voltage control as long as the frequency is variable; however, since the VCO is widely used, an example in which the VCO is used will be described below. The VCO 11 generates a clock CLK-I, and changes the control voltage to allow the frequency of the clock CLK-I to change. The PD 12 detects a phase difference (clock phase control signal) PDI between input data Data and the clock CLK-I. As is described later, the PD 12 herein has a function of a latch circuit, detects the phase difference PDI, captures the input data Data in synchronization with a change edge of the clock CLK-I, and outputs the captured input data Data as reception data Data out. The CP 13 performs adding and subtracting of the current to and from the loop filter 14 in accordance with the phase difference PDI, and the loop filter 14 generates a control voltage corresponding to the phase difference PDI. In other word, the CP 13 and the loop filter 14 form a control unit of the VCO 11. The VCO 11 changes an oscillating frequency in accordance with the control voltage.

With the configuration in the foregoing, a feedback circuit that changes the oscillating frequency (frequency of the clock CLK-I) of the VCO 11 is formed. This feedback circuit controls the VCO 11 such that the frequencies of the input data Data and the clock CLK-I match each other, and a change edge (falling edge) of the clock CLK-I matches a change edge of the input data Data, in other words, the phases match each other.

In a state where the frequencies and the phases of the input data Data and the clock CLK-I respectively match each other, a rising edge of the clock CLK-I matches a phase in the middle of the change edge of the input data Data, in other words, a state where the input data Data is stable. Thus, the PD 12 captures the input data Data in synchronization with the rising edge of the clock CLK-I, and outputs right reception data Data out.

As illustrated in FIG. 1B, even in the state where the frequencies and the phases of the input data Data and the clock CLK-I respectively match each other, the input data Data has jitter in which the phase varies from the clock CLK-I under the influence of a signal route of the input data Data. The rising edge of the clock CLK-I matches the phase in the middle of the change edge of the input data Data in the stable state even in a state where the jitter is present, thereby allowing the right reception data Data out to be captured, and the reception data Data out with the stable phase to be outputted.

Figure 2A:
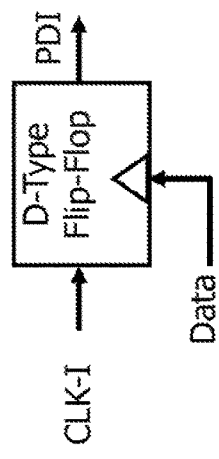
FIGS. 2A and 2B are diagrams illustrating a circuit example of the phase detector (PD) and a time chart illustrating an operation in the CDR circuit.
Figure 2B:
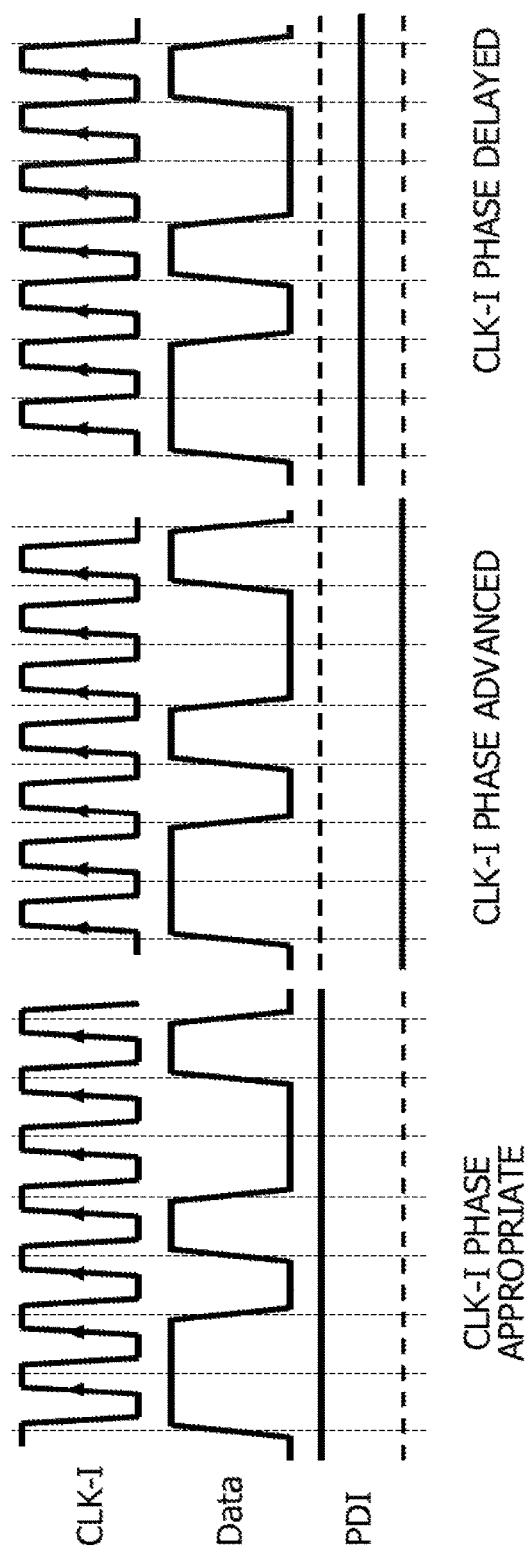

FIGS. 2A and 2B are diagrams illustrating a circuit example of the phase detector (PD) and a time chart illustrating an operation in the CDR circuit, and FIG. 2A illustrates the circuit example of the PD and FIG. 2B illustrates the time chart.

As illustrated in FIG. 2A, the phase detector (PD) is configured to include a D-type flip-flop (FF), and herein, the input data Data is inputted into a clock terminal of the D-FF and a clock CLK-I is inputted into a data terminal of the D-FF. This D-FF latches a value of the clock CLK-I when the input data Data changes, and outputs the latched value as the phase difference PDI. Although the example in which the input data Data is inputted into the clock terminal of the D-FF and the clock CLK-I is inputted into the data terminal of the D-FF is illustrated herein, a configuration in which the clock CLK-I is inputted into the clock terminal of the D-FF and the input data Data is inputted into the data terminal of the D-FF is also possible. In addition, although the input data Data and the clock CLK-I are illustrated as single-phase signals, a high-speed signal at several GHz or higher may be preferably implemented with a differential circuit. Accordingly, it is assumed that the D-FF in FIG. 2A latches the clock CLK-I not only at the rising edge of the input data Data but also at the falling edge thereof, and this applies to the following explanation and other signals. Note that the embodiments are not limited to this, but the single-phase signal is also operable. In a case of the differential signal, two latch circuits to which the inversed input data Data and clock CLK-I are inputted are used, thereby detecting changes in both of the rising edge and the falling edge.

The time chart of FIG. 2B illustrates a case where the CLK-I is phase delayed from the Data at the left side, a case where phase advanced at the center, and a case where phase appropriate (phases match) at the right side.

In the case where the CLK-I is phase delayed from the Data, the CLK-I is at a high (High: H) level in the change edge of the Data, and the phase difference PDI becomes an H level. In response to this, the VCO 11 is controlled so as to increase the oscillating frequency.

In the case where the CLK-I is phase advanced from the Data, the CLK-I is at a low (Low: L) level in the change edge of the Data, and the phase difference PDI becomes an L level. In response to this, the VCO 11 is controlled so as to decrease the oscillating frequency.

In the case where the phase of CLK-I with respect to Data is appropriate, although the CLK-I is determined as L or H in the change edge of the Data, the VCO 11 is thereafter controlled so as to be reversely determined and such a control is repeated, whereby the CLK-I is determined as L or H with the equal probability. With this, the PDI changes between L and H, the control voltage outputted from the loop filter 14 becomes an intermediate level between L and H. In FIG. 2A, for convenience of explanation, PDI is illustrated not as waveforms that alternately change to L or H, but as the phase difference at the intermediate level averaged by the loop filter 14.

The CDR circuit illustrated in FIG. 1A has such a problem that the frequency range that allows clock recovery is narrow. Thus, used is a CDR circuit using a phase frequency detector (PFD) that detects a frequency relation between input data and a clock, in addition to the phase difference between the input data and the clock.

Figure 3A:
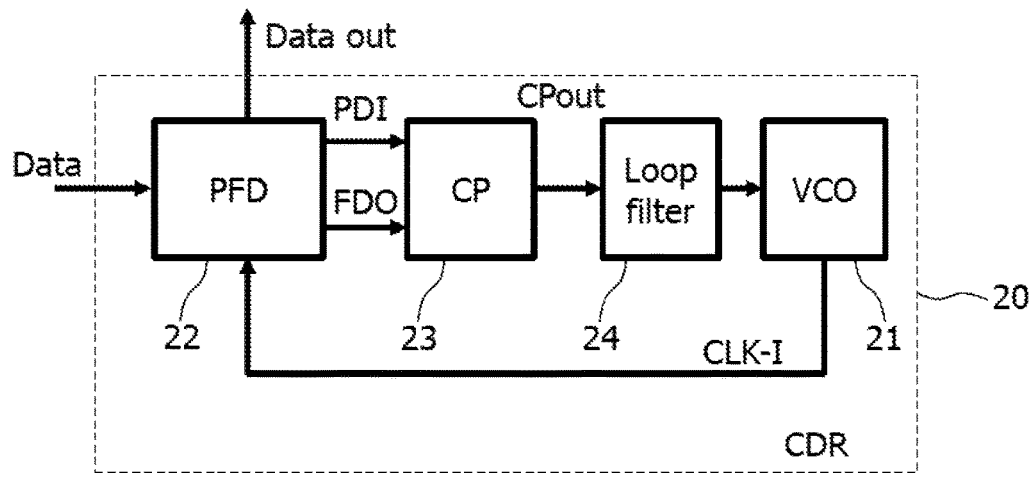
FIGS. 3A and 3B are diagrams illustrating a CDR circuit using a PFD.
Figure 3B:
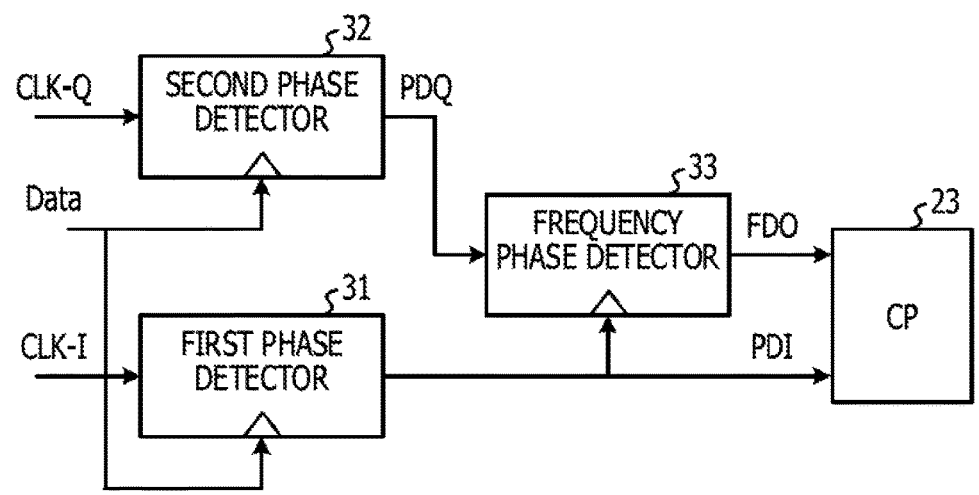

FIGS. 3A and 3B are diagrams illustrating a CDR circuit using a PFD, and FIG. 3A illustrates a block diagram and FIG. 3B is a block diagram illustrating a configuration of the PFD.

As illustrated in FIGS. 3A and 3B, a CDR circuit 20 includes a VCO 21, a phase frequency detector (PFD) 22, a CP 23, and a loop filter 24. The VCO 21 outputs, in addition to a first clock CLK-I, a second clock CLK-Q having a frequency the same as that of and a phase different from that of the CLK-I. For example, the CLK-Q is phase advanced by 90 degrees from the CLK-I. The PFD 22 detects a phase difference PDI between the input data Data and the clock CLK-I as well as a frequency phase signal FDO.

As illustrated in FIG. 3B, the PFD 22 includes a first phase detector 31, a second phase detector 32, and a frequency phase detector 33. As for the first phase detector 31, the second phase detector 32, and the frequency phase detector 33, those described in Non-patent document 1, for example, may be used. Non-patent document 1 describes a first phase detector and a second phase detector of a differential type that are respectively configured to include two sample hold circuit (latch circuit) and a multiplexer. Moreover, Non-patent document 1 describes a frequency phase detector of a differential type that is configured to include two latch circuits and a modified multiplexer.

The first phase detector 31 synthesizes values of the first clock CLK-I that is latched at the change edge of the input data Data, and outputs the synthesized value as a clock phase control signal PDI. The clock phase control signal PDI indicates whether the change edge of the CLK-I is advanced or delayed from the change edge of the Data. The second phase detector 32 synthesizes values of the second clock CLK-Q that is latched at the change edge of the Data, and outputs the synthesized value as a clock phase detection signal PDQ. The clock phase detection signal PDQ indicates whether a change edge of the CLK-Q is advanced or delayed from the change edge of the Data.

The frequency phase detector 33 generates a frequency phase signal FDO indicating, from the direction of the change edge of the PDI and the value of the PDQ that is latched at the change edge of the PDI, whether the frequency of the CLK-I is smaller or larger than the frequency of the Data. The FDO respectively indicates +1, −1, and 0 when the frequency of the CLK-I is smaller than, larger than, and the same as the frequency of the Data. The clock phase control signal PDI and the frequency phase signal FDO are supplied to the charge pump 23. With this, the VCO 21 is controlled based on the clock phase control signal PDI and the frequency phase signal FDO.

Figure 4A:
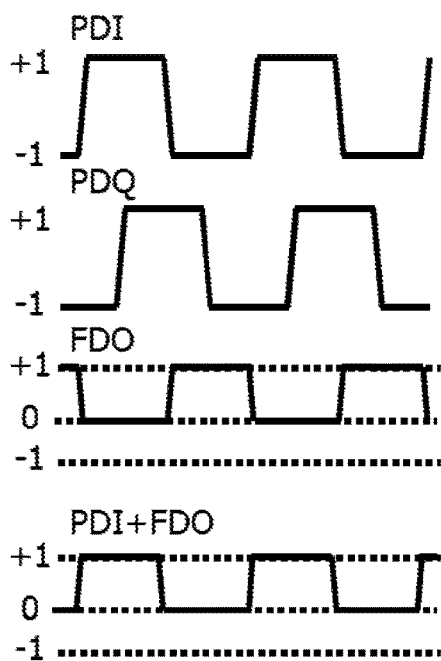
FIGS. 4A and 4B are time charts illustrating operations of respective units of the PFD in FIG. 3B.
Figure 4B:
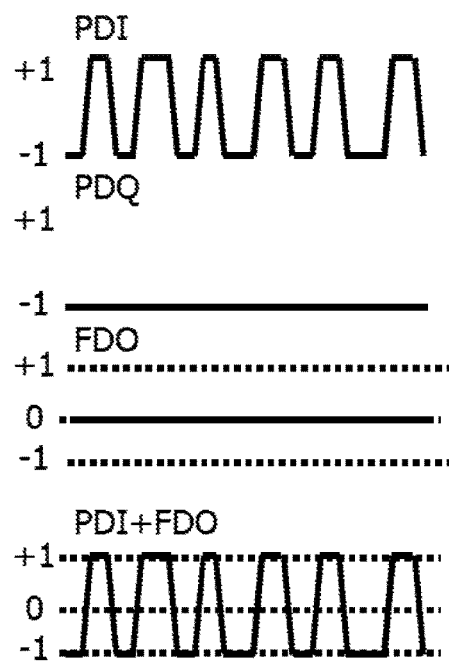

FIGS. 4A and 4B are time charts illustrating operations of respective units of the PFD in FIG. 3B, and FIG. 4A illustrates waveforms in an unlocked state where the frequencies of the input data Data and the first clock CLK-I are different from each other, and FIG. 4B illustrates waveforms in a locked state where the frequencies and the phases respectively match each other.

As illustrated in FIG. 4A, in the unlocked state where the frequencies of the Data and the CLK-I are different from each other, both of the clock phase control signal PDI and the clock phase detection signal PDQ change, and the frequency phase signal FDO also changes. FIG. 4A illustrates a state where the frequency of the CLK-I is smaller than the frequency of the Data, and the FDO changes between 0 and +1 in the reversed phase to that of the PDI as illustrated in the diagram. In a state where the frequency of the CLK-I is larger than the frequency of the Data, the FDO changes between 0 and −1. When the charge pump 23 and the loop filter 24 generate PDI+FDO in which the PDI and the FDO are synthesized by 1:1 as a control signal, the PDI+FDO changes between 0 and +1 to increase the oscillating frequency of the VCO 21. Note that the control signal is not limited to the PDI+FDO, and the weighting in the synthesis may be caused to vary in some cases.

As illustrated in FIG. 4B, in a state where the frequencies and the phases of the Data and the CLK-I respectively match each other, the clock phase control signal PDI changes, but the clock phase detection signal PDQ is fixed to a predetermined value (−1). Accordingly, the frequency phase signal FDO becomes zero. Thus, PDI+FDO becomes the PDI, so that the VCO 21 is controlled by only using the clock phase control signal PDI, without using the frequency phase signal FDO.

The CDR circuit is requested to decrease the electric power consumption. As in the foregoing, regardless that the frequency phase signal becomes zero in the locked state and thus does not have an influence on the control of the VCO, a circuit that detects a frequency phase signal operates to result in the useless electric power consumption by the circuit. The CDR circuit is mostly in the locked state in an actual operation, and it may be considered that stopping the frequency phase detector in the locked state makes it possible to decrease the electric power consumption.

However, stopping the frequency phase detector results in the CDR circuit that only uses the phase detector in which a frequency range that allows clock recovery is narrow, and thus there is such a problem of incapable of detecting the transition from the locked state to the unlocked state, and incapable of activating again the frequency phase detector at the unlocked time.

Detecting whether the CDR circuit is in a locked state or an unlocked state based on the clock phase control signal PDI outputted from the phase detector has not been performed heretofore.

The signal recovery circuit in the embodiments described below detects the transition from a locked state to an unlocked state not using the frequency phase detector.

Figure 5A:
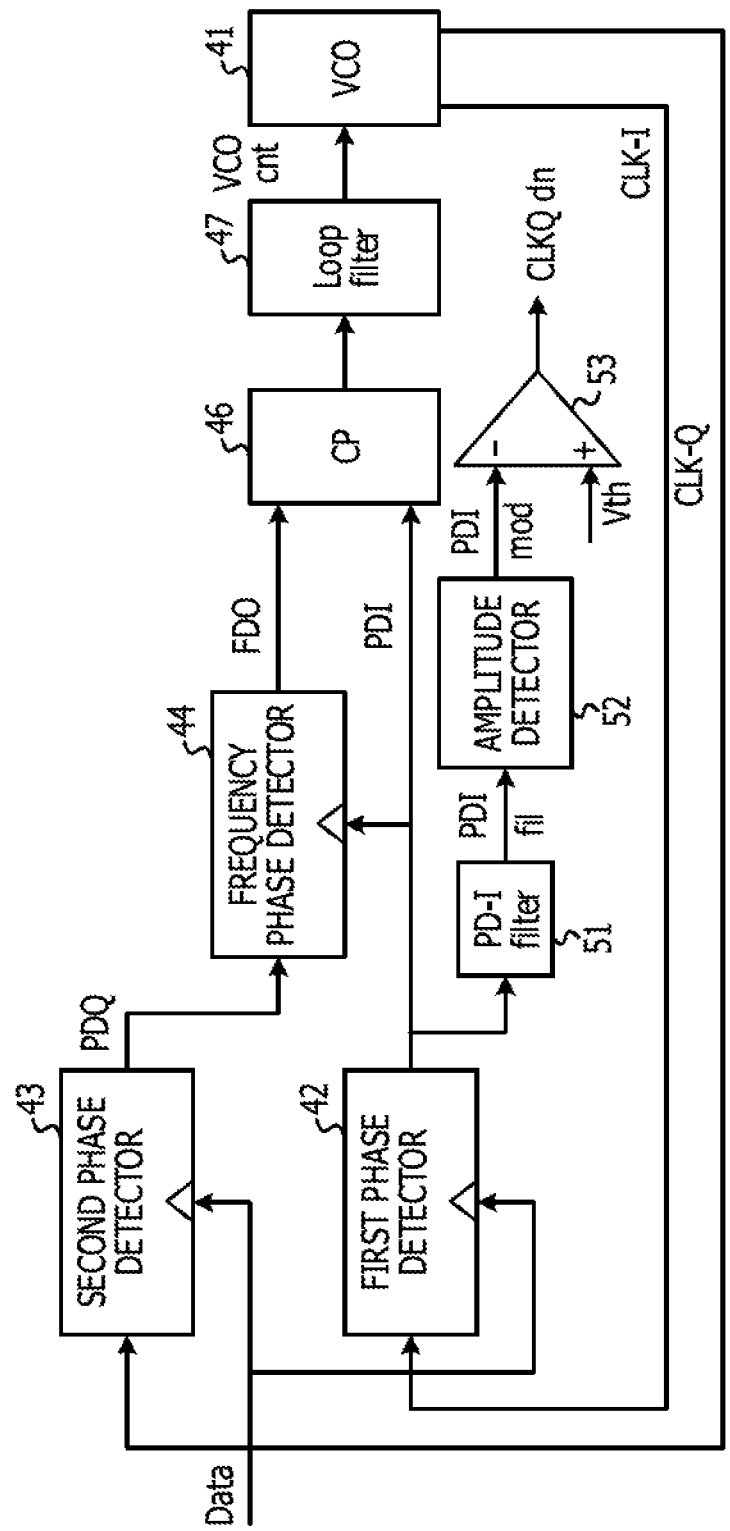
FIGS. 5A and 5B are diagrams illustrating a signal recovery (Clock Data Recovery: CDR) circuit according to a first embodiment.
Figure 5B:
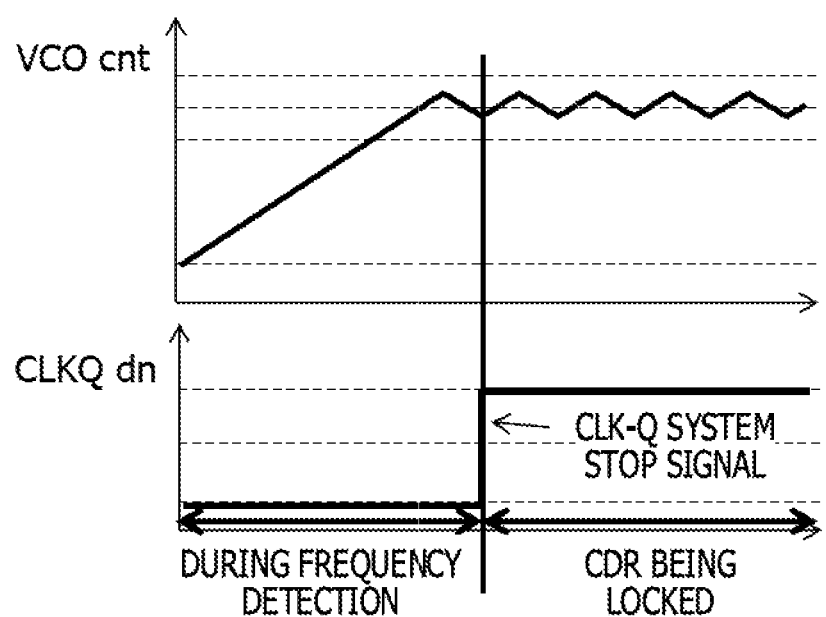

FIGS. 5A and 5B are diagrams illustrating a signal recovery (Clock Data Recovery: CDR) circuit according to a first embodiment, FIG. 5A illustrates a block diagram, and FIG. 5B is a time chart illustrating an operation when the CDR circuit is started.

The CDR circuit in the first embodiment includes a voltage control oscillator (VCO) 41, a first phase detector 42, a second phase detector 43, a frequency phase detector 44, a charge pump (CP) 46, and a loop filter 47. The CDR circuit in the first embodiment further includes a PD-I filter circuit 51, an amplitude detector 52, and a determination circuit 53. As for the VCO 41, the first phase detector 42, the second phase detector 43, the frequency phase detector 44, the CP 46, and the loop filter 47, the corresponding elements in FIG. 3 are applicable but not limited thereto.

The VCO 41 generates a first clock CLK-I and a second clock CLK-Q having a frequency the same as that of and a phase different from that of the first clock CLK-I, and changes the control voltage to change the frequencies of the clocks CLK-I and CLK-Q. The CLK-Q is phase advanced by 90 degrees from the CLK-I.

The first phase detector 42 synthesizes values of the first clock CLK-I that is latched at the change edge of the input data Data, and outputs the synthesized value as a clock phase control signal PDI. The clock phase control signal PDI indicates whether the change edge of the CLK-I is advanced or delayed from the change edge of the Data. The second phase detector 43 synthesizes values of the second clock CLK-Q that is latched at the change edge of the Data, and outputs the synthesized value as a clock phase detection signal PDQ. The clock phase detection signal PDQ indicates whether a change edge of the CLK-Q is advanced or delayed from the change edge of the Data. The frequency phase detector 44 generates a frequency phase signal FDO indicating, from the direction of the change edge of the PDI and the value of the PDQ that is latched at the change edge of the PDI, whether the frequency of the CLK-I is smaller or larger than the frequency of the Data. The FDO respectively indicates +1, −1, and 0 when the frequency of the CLK-I is smaller than, larger than, and the same as the frequency of the Data. The first phase detector 42, the second phase detector 43, and the frequency phase detector 44 are implemented by the circuits of a differential type described in Non-patent document 1, for example.

The CP 46 performs adding and subtracting the current with respect to the loop filter 47 in accordance with the PDI and the FDO in a frequency difference state, and performs adding and subtracting the current with respect to the loop filter 47 in accordance with the PDI in a normal locked state and in a reversed-phase locked state. The loop filter 47 generates a control voltage by performing adding and subtracting the current, and supplies the control voltage to the VCO 41.

The PD-I filter circuit 51 removes a high-frequency component of the clock phase control signal PDI, and outputs PDI fil including a low-frequency component.

Figure 6:
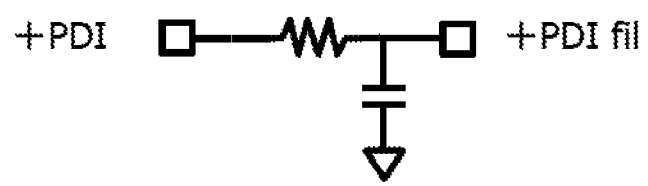
FIG. 6 is a diagram illustrating a configuration example of a PD-I filter circuit.
Figure 6:
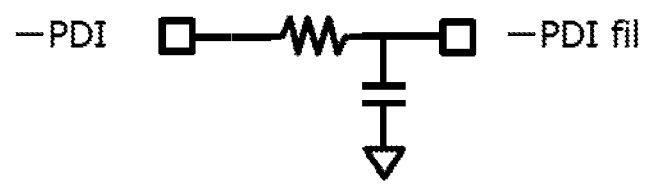

FIG. 6 is a diagram illustrating a configuration example of the PD-I filter circuit 51. The filter circuit in FIG. 6 is a widely known filter circuit, which is composed of a resistance and a capacitance element, and includes two similar first and second filter circuits because a differential signal is used. The first filter circuit receives an input of a positive polarity signal +PDI, and outputs a filtered positive polarity +PDI fil. The second filter circuit receives an input of a negative polarity signal −PDI, and outputs a filtered negative polarity −PDI fil.

The amplitude detector 52 detects the amplitude of the PDI fil outputted from the PD-I filter circuit 51, and outputs an amplitude signal PDI mod.

Figure 7:
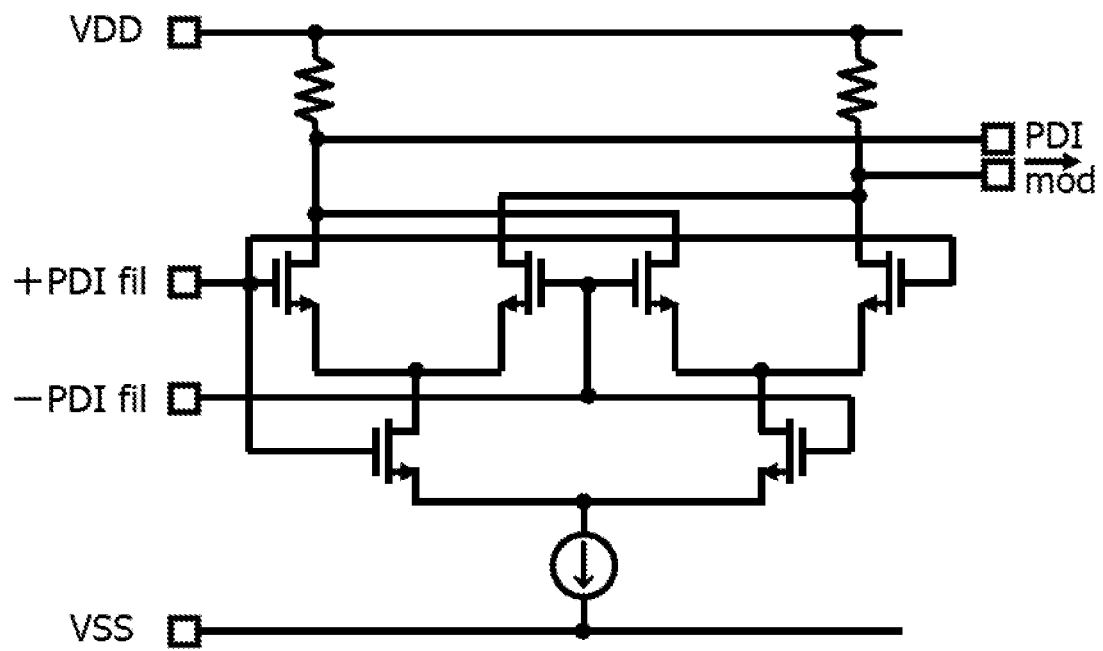
FIG. 7 is a diagram illustrating a configuration example of an amplitude detector.

FIG. 7 is a diagram illustrating a configuration example of the amplitude detector 52. The amplitude detector in FIG. 7 is a widely known computation circuit that performs multiplication (square computation) of the differential inputs +PDI fil and −PDI fil. The differential inputs +PDI fil and −PDI fil indicate +1 or −1 when the amplitude is large, while indicate 0 when the amplitude is small. Thus, the amplitude signal PDI mod=1 is obtained when +1 or −1 is indicated at the large amplitude, and the amplitude signal PDI mod=0 is obtained when 0 is indicated at the small amplitude.

The determination circuit 53 compares the amplitude signal PDI mod outputted from the amplitude detector 52 with a threshold value Vth, and outputs a determination result CLKQ dn. The determination result CLKQ dn becomes 0 when the amplitude is large, in other words, larger than the Vth, while becomes 1 when the amplitude is small, in other words, smaller than the Vth.

The configuration in the foregoing forms a feedback control system in which the frequency of the first clock CLK-I matches the frequency of the input data Data, and the falling edge of the CLK-I is synchronized with the change edge of the Data. In other words, the first phase detector 42, the second phase detector 43, the frequency phase detector 44, the CP 46, the loop filter 47, the PD-I filter circuit 51, the amplitude detector 52, and the determination circuit 53 form a feedback control circuit that controls the VCO 41. In addition, the first phase detector 42, the second phase detector 43, and the frequency phase detector 44 form a phase frequency detector (PFD) that detects the phase relation and the frequency relation between the Data and the CLK-I. Moreover, the PD-I filter circuit 51, the amplitude detector 52, and the determination circuit 53 form a state detection circuit that detects whether the CDR circuit is in a locked state or an unlocked state (frequency difference state).

FIG. 5B illustrates the change of the oscillating frequency (the frequency of the CLK-I) of the VCO 41 at the upper side, and the change of the CLKQ dn at the lower side.

When the CDR circuit is started, the oscillating frequency of the VCO 41 monotonically increases from a free-running frequency by the feedback control. When the oscillating frequency of the VCO 41 increases to a predetermined range (tracking range of the PDI) before and after a lock frequency that is the frequency of the Data, and the state detection circuit detects the increase, the CLKQ dn changes to 1. The change range of the oscillating frequency of the VCO 41 from the free-running frequency to the tracking range of the PDI is a frequency pulling range by an frequency difference (FD) operation. The use of the PFD allows the larger frequency pulling range than that when the PD is used. In the locked state, the oscillating frequency of the VCO 41 repeatedly increases or decreases by the feedback control so as to match the lock frequency.

Figure 8:
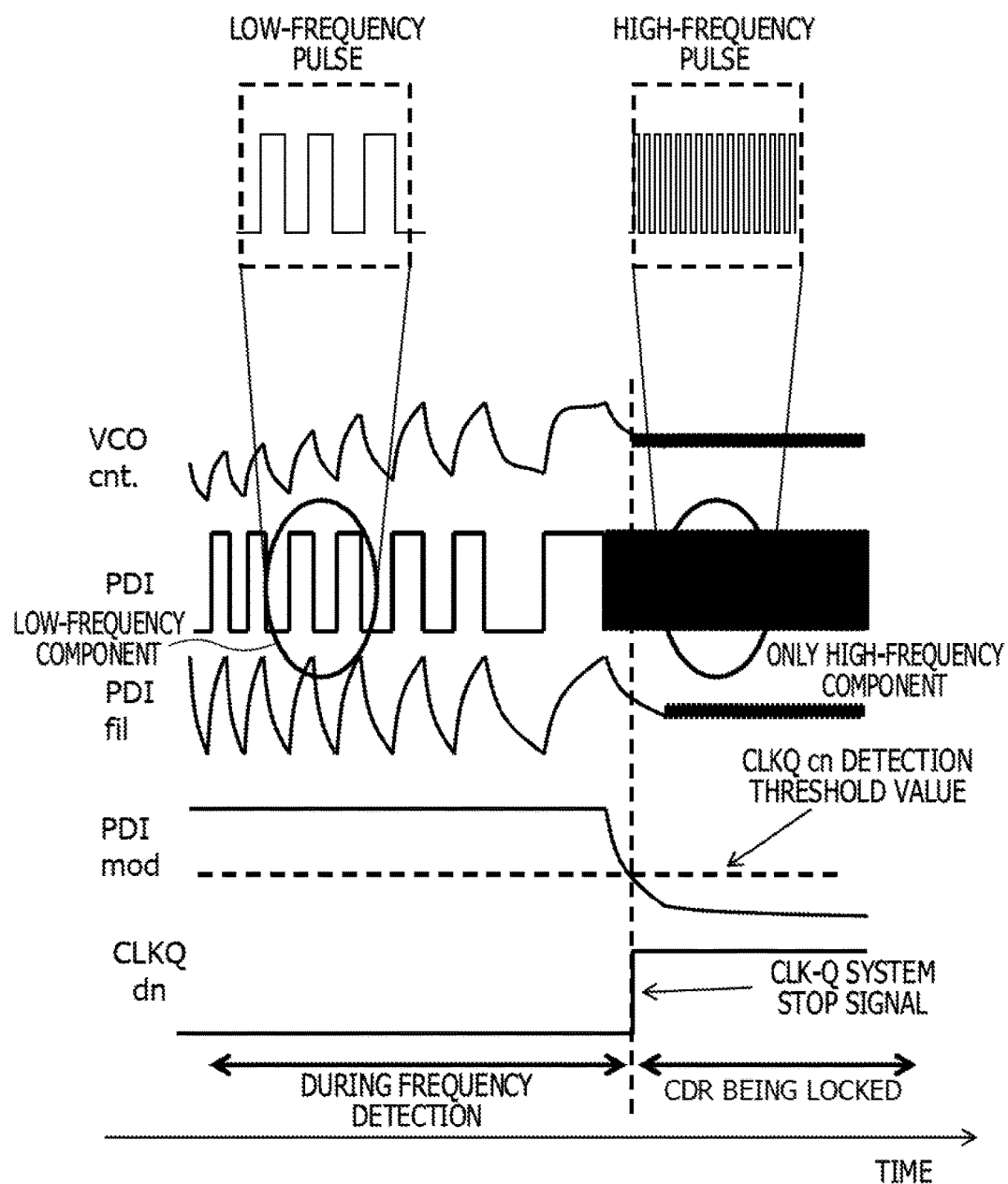
FIG. 8 illustrates operation waveforms of respective units of the CDR circuit in the first embodiment.

FIG. 8 illustrates operation waveforms of the respective units of the CDR circuit in the first embodiment. FIG. 8 illustrates operation waveforms of a control signal VCO cnt of the VCO 41, the PDI, the PDI fil, the PDI mod, and the CLKQ dn when the CDR circuit is started, becomes in a locked state, and holds the state.

After the CDR circuit is started, the VCO 41 increases the oscillating frequency from the free-running frequency. When the oscillating frequency of the VCO 41 becomes within the frequency pulling range, the VCO cnt repeatedly increases or decreases with the comparative large amplitude and the low frequency, the center level gradually raises, and the frequency of the change signal gradually decreases. When the oscillating frequency of the VCO 41 becomes within a synchronization frequency range, the VCO cnt is in a state where the VCO cnt changes with the small amplitude and the high frequency at the fixed level as a center.

Meanwhile, when the oscillating frequency of the VCO 41 becomes within the frequency pulling range, the edges of the CLK-I and the Data are in a state where the phases are close to each other to some extent, and the VCO 41 is feedback controlled such that the phase difference becomes zero. In addition, when the oscillating frequency becomes within the synchronization frequency range, the edges of the CLK-I and the Data nearly match each other, and the phases are repeatedly advanced and delayed by the feedback control. Accordingly, such a state is repeated in which the PDI changes with the comparative low-frequency when the oscillating frequency is within the frequency pulling range (frequency difference state), changes so as to gradually decrease the frequency, and changes with the high frequency when the oscillating frequency is within the synchronization frequency range. This indicates a locked state.

Thus, as illustrated in FIG. 8, the signal PDI fil of a low-frequency component in which a high-frequency component is removed from the PDI changes with the comparative low-frequency when the oscillating frequency is within the frequency pulling range, and becomes an unchanging signal at an intermediate level when the oscillating frequency is within the synchronization frequency range.

Accordingly, the amplitude signal PDI mod of the PDI fil becomes a high-level signal when the oscillating frequency is within the frequency pulling range, and changes to a low-level signal when the oscillating frequency becomes within the synchronization frequency range. Thus, the CLKQ do is at the low level when the oscillating frequency is within the frequency pulling range, and changes to the high level when the oscillating frequency becomes within the synchronization frequency range.

As described in the foregoing, with the CDR circuit in the first embodiment, the state detection circuit including the PD-I filter circuit 51, the amplitude detector 52, and the determination circuit 53 detects whether the CDR circuit is in a locked state or an unlocked state (state where the oscillating frequency is within the frequency pulling range).

Note that the state detection circuit is effective also in a case where no second phase detector 43 and no frequency phase detector 44 are present, and is capable of detecting whether the CDR circuit is in a locked state or an unlocked state based on the clock phase control signal PDI outputted from the first phase detector 42.

Figure 9:
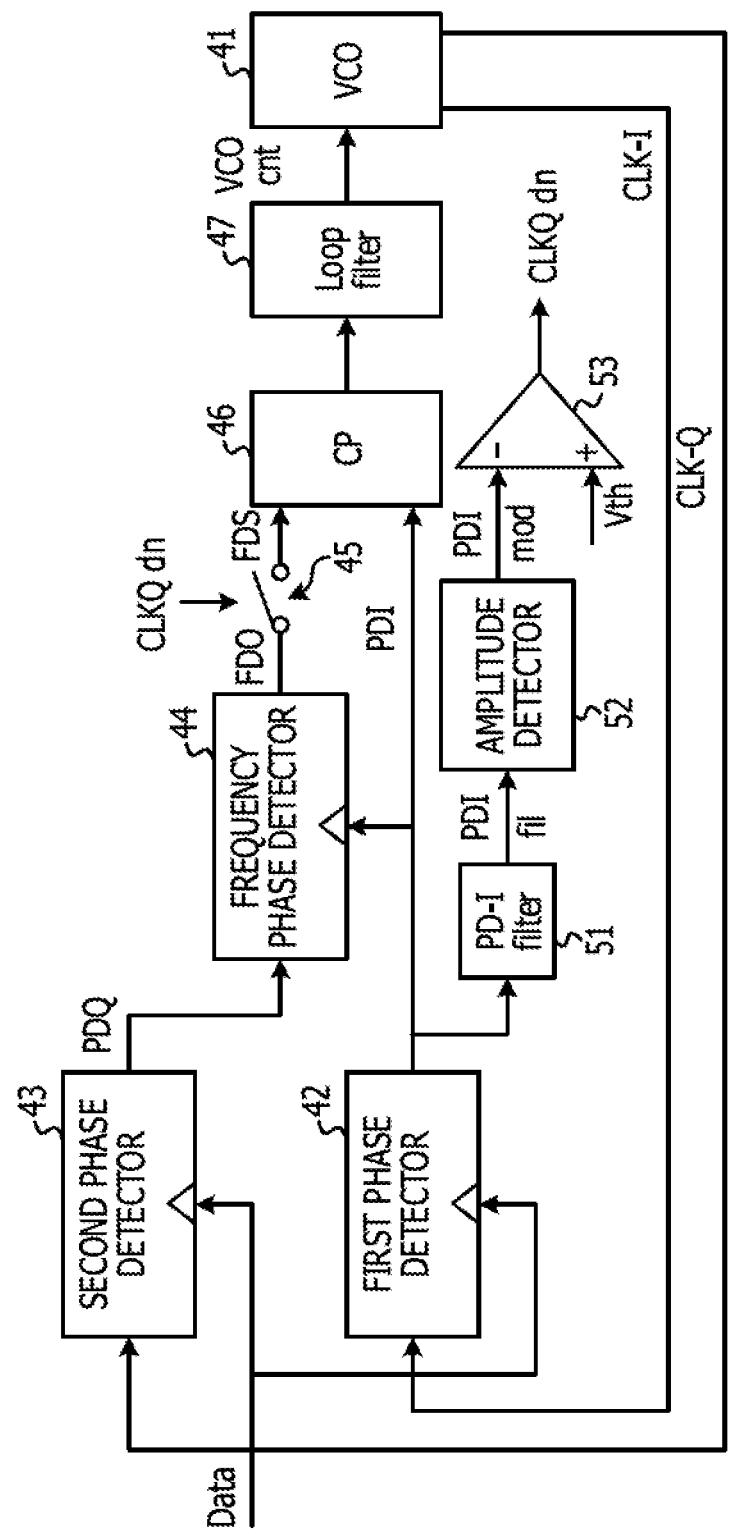
FIG. 9 is a block diagram of a signal recovery (Clock Data Recovery: CDR) circuit according to a second embodiment.

FIG. 9 is a block diagram of a signal recovery (Clock Data Recovery: CDR) circuit according to a second embodiment.

The CDR circuit in the second embodiment is different from the CDR circuit in the first embodiment in that a switch 45 is provided between the frequency phase detector 44 and the CP 46, and other portions are the same as those of the CDR circuit in the first embodiment.

The switch 45 switches, in accordance with the CLKQ do outputted from the determination circuit 53, whether or not the frequency phase signal FDO outputted from the frequency phase detector 44 is supplied to the CP 46. Specifically, the switch 45 switches such that the FDO is supplied to the CP 46 in an unlocked state (state where the oscillating frequency is within the frequency pulling range), in other words, in the frequency difference (FD) state, and the FDO is not supplied to the CP 46 in a locked state. Herein, a signal supplied from the switch 45 to the CP 46 is represented as FDS. Accordingly, the FDS is the FDO in the frequency difference state, and is a fixed value (for example, 0) that does not have an influence on the CP 46 in the locked state.

The CP 46 performs adding and subtracting the current with respect to the loop filter 47 in accordance with the PDI and the FDS in the frequency difference state, and performs adding and subtracting the current with respect to the loop filter 47 in accordance with the PDI in the locked state. The loop filter 47 generates a control voltage by performing adding and subtracting the current, and supplies the control voltage to the VCO 41.

Even in the locked state, at the time of reception of signals with high jitter, the frequency phase signal may vary, the frequency phase detector 44 may operate, and a frequency phase signal indicating that the frequencies of the input data and the first clock do not match may be outputted. When such a frequency phase signal is inputted into the CP 46, the control of the VCO is temporarily changed, and a lost synchronization (unlock) error indicating that the frequency of the first clock is different from the frequency of the input data is outputted. Meanwhile, with the CDR circuit in the second embodiment, even when the frequency phase detector 44 generates a frequency phase signal FDO indicating that the frequencies do not match due to the reception of signals with high jitter, the frequency phase signal FDO is not immediately inputted into the CP 46, thereby generating no lost synchronization error. As a matter of course, when the CDR circuit becomes within the unlocked state, the value of the CLKQ dn changes to the value indicating the unlocked state, and the switch 45 is conducted to allow the frequency phase signal to be inputted into the CP 46, thereby implementing the wide frequency pulling range.

Figure 10:
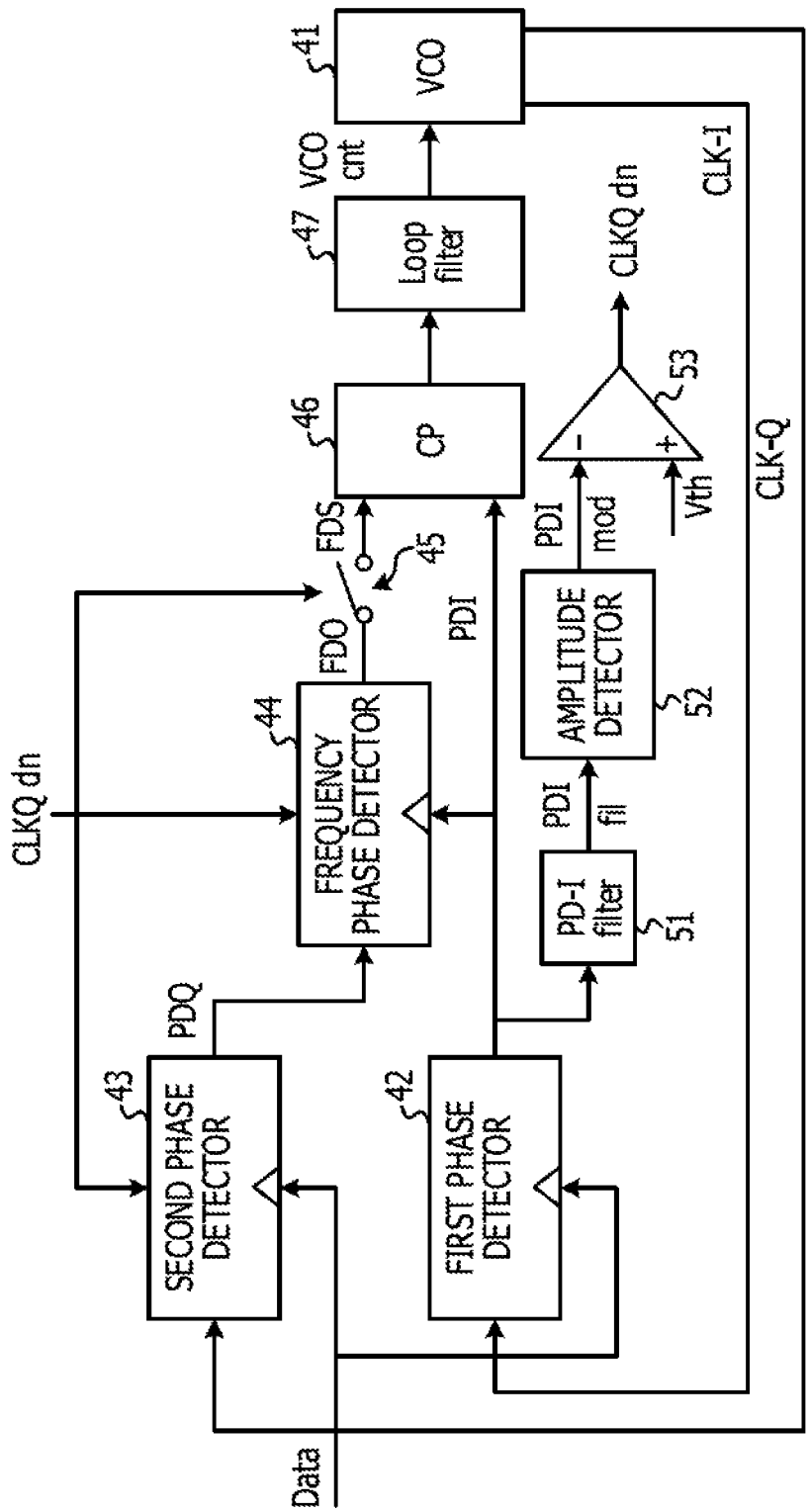
FIG. 10 is a block diagram of a signal recovery (Clock Data Recovery: CDR) circuit according to a third embodiment.

FIG. 10 is a block diagram of a signal recovery (Clock Data Recovery: CDR) circuit according to a third embodiment.

The CDR circuit in the third embodiment is different from the CDR circuit in the second embodiment in that the second phase detector 43, the frequency phase detector 44, and the switch 45 are turned off in accordance with the CLKQ dn, and other portions are the same as those of the CDR circuit in the second embodiment. When the CLKQ dn indicates the unlocked state, the second phase detector 43 and the frequency phase detector 44 become in an operation state, and the switch 45 is conducted. When the CLKQ dn indicates the locked state, the second phase detector 43 and the frequency phase detector 44 become in an non-operation state, and the switch 45 is interrupted.

The CDR circuit in the third embodiment has an effect similar to that of the CDR circuit in the second embodiment that no lost synchronization error due to the reception of signals with high jitter is generated, and allows the electric power consumption to be decreased because the second phase detector 43 and the frequency phase detector 44 are stopped. In the CDR circuit in the third embodiment, the second phase detector 43 and the frequency phase detector 44 operate before the CDR circuit becomes in the locked state, thereby implementing the wide frequency pulling range. Meanwhile, once the CDR circuit becomes in the locked state, the frequency phase signal FDO is not used. Thus, even if no frequency phase signal FDO is generated by the second phase detector 43 and the frequency phase detector 44, this causes no special problem. In an actual operation of the CDR circuit, the CDR circuit is mostly in the locked state, so that stopping the operations of the second phase detector 43 and the frequency phase detector 44 in the locked state makes it possible to obtain the large reduction effect of the electric power consumption. The CDR circuit presented as an example implemented the reduction in electric power consumption by approximately 20%.

In the CDR circuit in the third embodiment, when the CDR circuit is changed from in the locked state to the unlocked state, the value of the CLKQ do changes to the value indicating the unlocked state, the second phase detector 43 and the frequency phase detector 44 become in an operation state in response to the change, and the switch 45 is conducted. This allows the frequency phase signal to be inputted into the CP 46, thereby implementing the wide frequency pulling range.

Although the configuration in which the frequency phase signal FDO is generated using the clock phase control signal PDI and the clock phase detection signal PDQ is indicated in the CDR circuit in the third embodiment, as long as the CDR circuit operates only using the clock phase control signal PDI in the locked state and causes the circuit of frequency synchronization to operate in the unlocked state, the configuration is not limited to that of the CDR circuit in the third embodiment. It is possible to implement the wide frequency pulling range and the operation only using the clock phase control signal PDI in the locked state with the CDR of other configuration.

In the CDR circuits in the first to the third embodiments described in the foregoing, although the PD-I filter circuit 51 is a low-pass filter that removes the high-frequency component of the clock phase control signal PDI and outputs the low-frequency component, a high-pass filter is also available. As illustrated in FIG. 8, the PDI mainly includes a comparative low-frequency component in the unlocked state (during the frequency detection), and mainly includes a comparative high-frequency component in the locked state. Thus, when the PD-I filter circuit 51 is a high-pass filter, the PDI fil becomes a signal at an intermediate level with the small amplitude in the unlocked state (during the frequency detection), and becomes a high frequency signal with the large amplitude in the locked state. Accordingly, the amplitude signal PDI mod is small in the unlocked state (during the frequency detection) and is large in the locked state, and when the amplitude signal PDI mod is compared with a threshold value with the logic reverse to that of the first to third embodiments, the CLKQ do is the same signal in the first to the third embodiments.

Figure 11A:
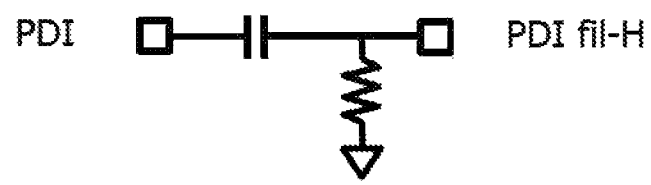
FIGS. 11A to 11C are diagrams illustrating a high-pass filter, a band pass filter, and frequency characteristics of the band pass filter.
Figure 11B:
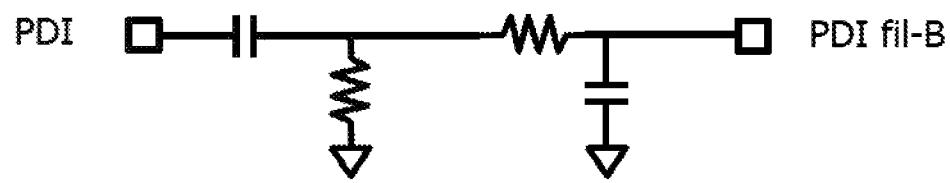
Figure 11C:
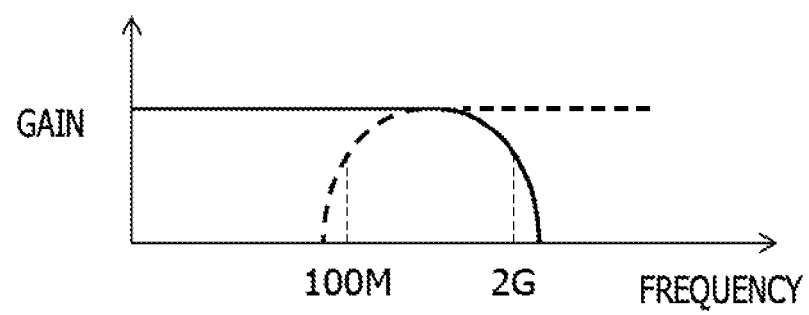

FIGS. 11A to 11C are diagrams illustrating a high-pass filter, a band pass filter, and frequency characteristics of the band pass filter, and FIG. 11A illustrates a circuit diagram of the high-pass filter, FIG. 11B illustrates a circuit diagram of the band pass filter, and FIG. 11C illustrates the frequency characteristics.

The high-pass filter in FIG. 11A is a widely known filter, which is composed of a resistance and a capacitance element. If a differential signal is used, two filter circuits in FIG. 11A are used as illustrated in FIG. 6.

As illustrated in FIG. 8, the clock phase control signal PDI is a low-frequency signal in comparison with the high frequency, but is a signal having a frequency higher than a certain level. This represents that, when noise is removed, the low-frequency component lower than a certain level including the direct-current component is desirably not extracted. Thus, as the PD-I filter circuit 51 in the first to the third embodiments, a band pass filter may preferably be used and a component in a certain frequency band of the PDI may be extracted.

The band pass filter in FIG. 11B has such a configuration that a high-pass filter and a low-pass filter are connected in series. For example, the high-pass filter has a characteristic illustrated by a dashed line in FIG. 11C, in other words, a characteristic of allowing a frequency component at 100 MHz or higher to pass therethrough. The low-pass filter has a characteristic illustrated by a solid line in FIG. 11C, in other words, a characteristic of allowing a frequency component at 2 GHz or lower to pass therethrough. Accordingly, the band pass filter allows the frequency component at 100 MHz or higher and 2 GHz or lower to pass therethrough.

Figure 12A:
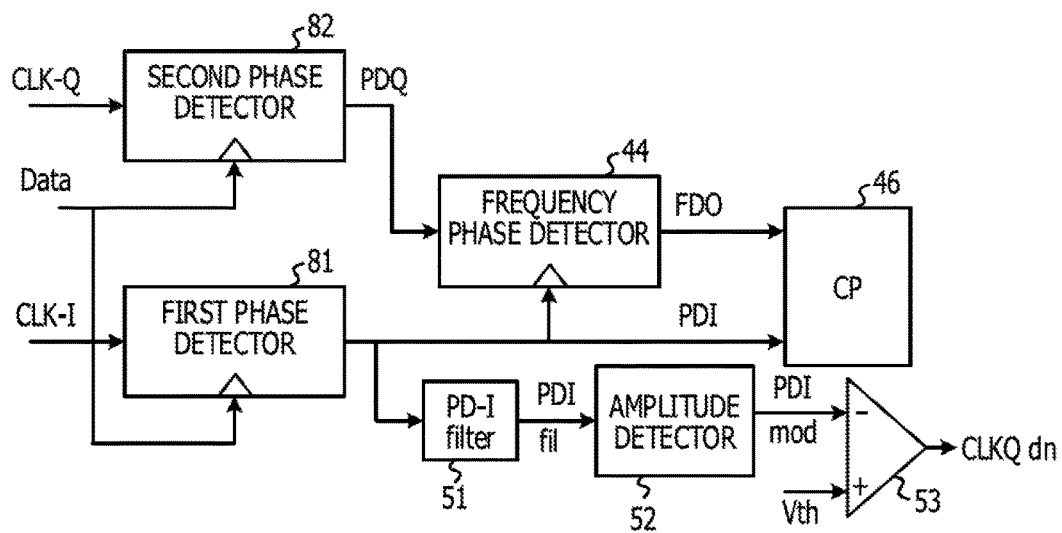
FIGS. 12A and 12B are diagrams illustrating a CDR circuit according to a fourth embodiment.
Figure 12B:
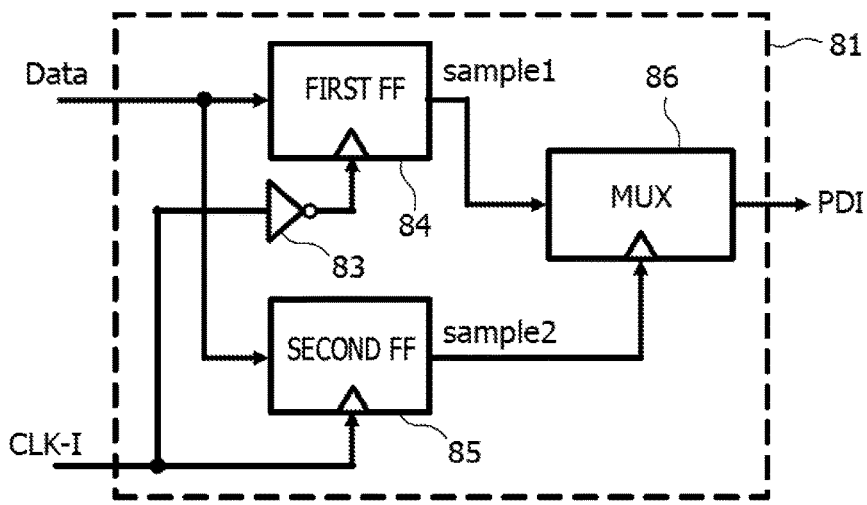

FIGS. 12A and 12B are diagrams illustrating a CDR circuit according to a fourth embodiment. FIG. 12A is a circuit block diagram illustrating a configuration including first and second phase detectors, a frequency phase detector, a CP, a PD-I filter circuit, an amplitude detector, and a determination circuit. FIG. 12B illustrates a circuit example of the first phase detector.

The CDR circuit in the fourth embodiment has a configuration similar to that of the CDR circuit in the first embodiment in FIG. 5, is different from that of the first embodiment only in the configuration of the first phase detector and the second phase detector, and other portions are the same as those in the first embodiment. A first phase detector 81 uses the first clock CLK-I as a trigger to detect the phase of the input data Data with respect to the change edge of the CLK-I. A second phase detector 82, which has a frequency the same as that of the CLK-I, uses the second clock CLK-Q the phase of which is advanced by 90 degrees as a trigger to detect the phase of the input data Data with respect to the change edge of the CLK-Q.

As illustrated in FIG. 12B, the first phase detector 81 includes an inverter 83, a first flip-flop (FF) 84, a second FF 85, and a multiplexer (MUX) 86. The inverter 83 inverses the CLK-I to output a/CLK-I. The first FF 84 is an FF that uses the Data as an input and the/CLK-I as a trigger, and latches a value of the Data at a rising edge of the/CLK-I, and outputs the latched value as a sample 1. The second FF 85 is an FF that uses the Data as an input and the CLK-I as a trigger, and latches a value of the Data at a rising edge of the CLK-I, and outputs the latched value as a sample 2. The MUX 86 synthesizes the sample 1 and sample 2 to generate a clock phase control signal PDI.

The second phase detector 82 has a configuration illustrated in FIG. 12B, but is different from the configuration in that a CLK-Q, instead of the CLK-I, is inputted, and a clock phase detection signal PDQ is outputted.

When the Data, the CLK-I, and the CLK-Q are differential signals, the phase detector in FIG. 12B is implemented as the phase detector PD described in Non-patent document 1, for example.

The configuration of the fourth embodiment is applicable to the second and the third embodiments, other operations and effects are the same as those in the first to the third embodiments, and explanations thereof are omitted.

The signal recovery (CDR) circuits in the first to the fourth embodiments have been described in the foregoing. Next, a device that uses the CDR circuit in the embodiment will be described.

Figure 13:
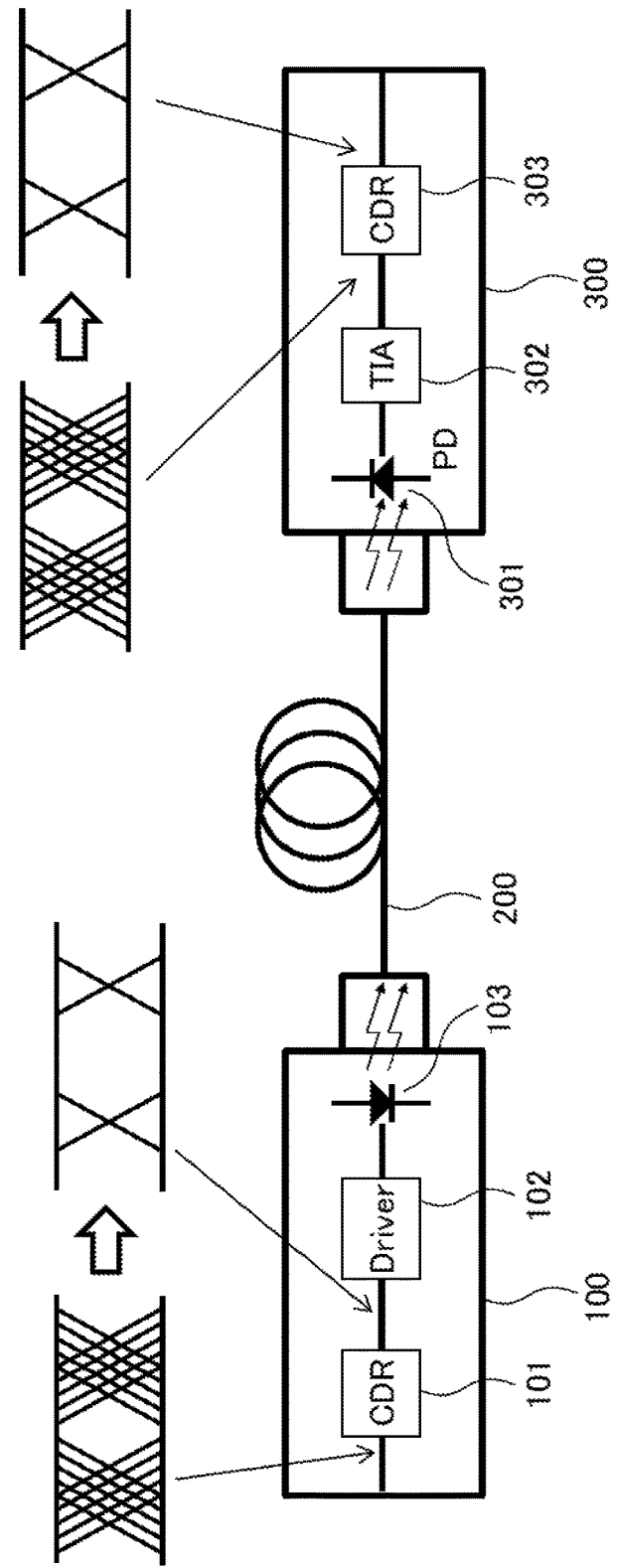
FIG. 13 is a diagram illustrating a configuration of an optical communication system that uses the CDR circuit in the embodiments.

FIG. 13 is a diagram illustrating a configuration of an optical communication system that uses the CDR circuit in the embodiments.

The optical communication system includes a transmitter 100 that converts a transmission signal into an optical signal and outputs the optical signal, an optical fiber 200 that transfers the optical signal from the transmitter 100, and a receiver 300 that receives the optical signal and recovers a reception signal. The transmitter 100 recovers a transmission signal transmitted from an electronic device or the like, and generates an optical signal. Moreover, the transmitter 100 may be a relay device that temporarily converts an optical signal received via an optical fiber into an electric signal, thereafter converts the electric signal into an optical signal again, and outputs the optical signal. The receiver 300 outputs the recovered reception signal as an electric signal to an electronic device or the like. Moreover, the receiver 300 may be a relay device that converts the reception signal into an optical signal again, and outputs the optical signal.

The transmitter 100 includes a signal recovery (CDR) circuit 101, a driver 102, and a laser diode (LD) 103. The signal recovery (CDR) circuit 101 recovers a clock from the received data signal and recovers a transmission data signal. The driver 102 drives the LD 103 in accordance with the transmission data signal, generates an optical signal, and outputs the optical signal to the optical fiber 200.

The receiver 300 includes a photo diode (PD) 301, a transformer impedance amplifier (TIA) 302, and a signal recovery (CDR) circuit 303. The PD 301 converts an optical signal received from the optical fiber 200 into an electric reception data signal. The TIA 302 amplifies the reception data signal. The CDR circuit 303 recovers a clock from the reception data signal and recovers the reception data signal.

The signal recovery (CDR) circuits in the embodiments may be used as the signal recovery (CDR) circuits 101 and 303 in FIG. 13. Note that the signal recovery (CDR) circuits in the embodiments are available not only for an optical communication system, but are applicable to any circuit when a circuit that performs transmission/reception of data signals modulated in synchronization with a clock in the inside or outside of an electronic device, and recovers the clock from the data signal. For example, the signal recovery (CDR) circuits in the embodiments are available in the fields where a higher bit rate is desired, such as the field of high-speed I/O in which signals are transmitted and received in an integrated circuit chip and between chips (in a device, between devices).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal recovery circuit comprising:
    an oscillator configured to control a frequency of generating first clock; and
    a feedback circuit configured to control the oscillator in order that input data is synchronized with the first clock in accordance with a phase relation between the input data and the first clock, wherein the feedback circuit includes:
        a controller configured to control the oscillator in accordance with the phase relation between the input data and the first clock;
        a first phase detector configured to generate a clock phase control signal in accordance with the phase relation between the input data and the first clock; and
        a state detection circuit configured to detect whether the signal recovery circuit is in a locked state or an unlocked state, based on a magnitude of an amplitude of a first component or a second component of the clock phase control signal, a frequency of the first component being higher than a frequency of the second component.

2. The signal recovery circuit according to claim 1, wherein
    the oscillator generates a second clock having a frequency the same as that of and a phase different from that of the first clock, and
    the feedback circuit includes:
    a second phase detector configured to generate a clock phase detection signal in accordance with a second phase relation between the input data and the second clock; and
    a frequency phase detector configured to compare the clock phase control signal with the clock phase detection signal, and generate a frequency phase signal indicating a frequency relation between the input data and the first clock, and
    the controller configured to control the oscillator in accordance with the clock phase control signal and the frequency phase signal.

3. The signal recovery circuit according to claim 2, further comprising: a switch that switches such that the frequency phase signal is supplied to the controller when the signal recovery circuit is in the unlocked state, and the frequency phase signal is not supplied to the controller when the signal recovery circuit is in the locked state.

4. The signal recovery circuit according to claim 3, wherein the feedback circuit
    arranges the second phase detector and the frequency phase detector in a non-operation state when the signal recovery circuit is in the locked state, and
    arranges the second phase detector and the frequency phase detector in an operation state when the signal recovery circuit is in the unlocked state.

5. The signal recovery circuit according to claim 2, wherein the second clock has a phase different from the first clock by 90 degrees.

6. The signal recovery circuit according to claim 1, wherein the state detection circuit includes:
    a low-pass filter configured to extract the second component from the clock phase control signal;
    an amplitude detector configured to detect an amplitude of a signal outputted from the low-pass filter; and
    a determination circuit configured to determine that the signal recovery circuit is in the unlocked state when an amplitude value outputted from the amplitude detector is a predetermined level or higher, and determine that the signal recovery circuit is in the locked state when the amplitude value is the predetermined level or lower.

7. The signal recovery circuit according to claim 1, wherein the state detection circuit includes:
    a high-pass filter configured to extract the first component from the clock phase control signal;
    an amplitude detector configured to detect an amplitude of a signal outputted from the high-pass filter; and
    a determination circuit configured to determine that the signal recovery circuit is in the locked state when an amplitude value outputted from the amplitude detector is a predetermined level or higher, and determine that the signal recovery circuit is in the unlocked state when the amplitude value is the predetermined level or lower.

8. The signal recovery circuit according to claim 1, wherein the state detection circuit includes:
    a band pass filter configured to extract a frequency component between a lower limit and an upper limit from the clock phase control signal;
    an amplitude detector configured to detect an amplitude of a signal outputted from the band pass filter; and
    a determination circuit configured to determine that the signal recovery circuit is in the unlocked state when an amplitude value outputted from the amplitude detector is a predetermined level or higher, and determine that the signal recovery circuit is in the locked state when the amplitude value is the predetermined level or lower.

9. An electric device including a signal recovery circuit configured to recovery a clock from input signal and obtain the input signal on the basis of the clock, comprising:
    an oscillator configured to control a frequency of generating first clock; and
    a feedback circuit configured to control the oscillator in order that input signal is synchronized with the first clock in accordance with a phase relation between the input signal and the first clock, wherein the feedback circuit includes:
        a controller configured to control the oscillator in accordance with the phase relation between the input signal and the first clock;
        a first phase detector configured to generate a clock phase control signal in accordance with the phase relation between the input signal and the first clock; and a state detection circuit configured to detect whether the signal recovery circuit is in a locked state or an unlocked state, based on a magnitude of an amplitude of a first component or a second component of the clock phase control signal, a frequency of the first component being higher than a frequency of the second component.

10. A signal recovery method of a signal recovery circuit comprising:

controlling a frequency of generating first clock;

generating a clock phase control signal in accordance with a phase relation between input data and the first clock;

detecting whether the signal recovery circuit is in a locked state or an unlocked state, based on a magnitude of an amplitude of a first component or a second component of the clock phase control signal, a frequency of the first component being higher than a frequency of the second component; and controlling the frequency of the first clock in order that input data is synchronized with the first clock in accordance with the clock phase control signal.

* * * * *